United States Patent [19]

Nuzillat

[11] 4,277,794
[45] Jul. 7, 1981

[54] STRUCTURE FOR LOGIC CIRCUITS

[75] Inventor: Gerard Nuzillat, Paris, France

[73] Assignee: Thomson-CSF, Paris, France

[21] Appl. No.: 72,841

[22] Filed: Sep. 6, 1979

Related U.S. Application Data

[63] Continuation of Ser. No. 855,618, Nov. 29, 1977, abandoned.

[30] Foreign Application Priority Data

Dec. 3, 1976 [FR] France ............................ 76 36534

[51] Int. Cl.³ ............................................. H01L 27/02
[52] U.S. Cl. ................................... 357/40; 357/34; 357/35; 357/36; 357/46; 357/48; 357/92
[58] Field of Search ..................... 357/34, 35, 36, 40, 357/46, 48, 92

[56] References Cited

U.S. PATENT DOCUMENTS 4,038,680  7/1977  Yagi et al. ............................. 357/48
4,056,810  11/1977  Hart et al. ............................. 357/48

Primary Examiner—Edward J. Wojciechowicz
Attorney, Agent, or Firm—Cushman, Darby & Cushman

[57] ABSTRACT

A structure for logic circuits comprises a current source formed by a PNP transistor and two complementary transistors integrated on the same N-type substrate. A buried plate and P-type walls forms insulating housings. These two complementary transistors are of the vertical type and the PNP transistor has the buried layer as its collector. This buried layer and the insulating walls enable current to be injected into the PNPN structure which eliminates the need for surface interconnection networks and increases the integration density.

6 Claims, 11 Drawing Figures

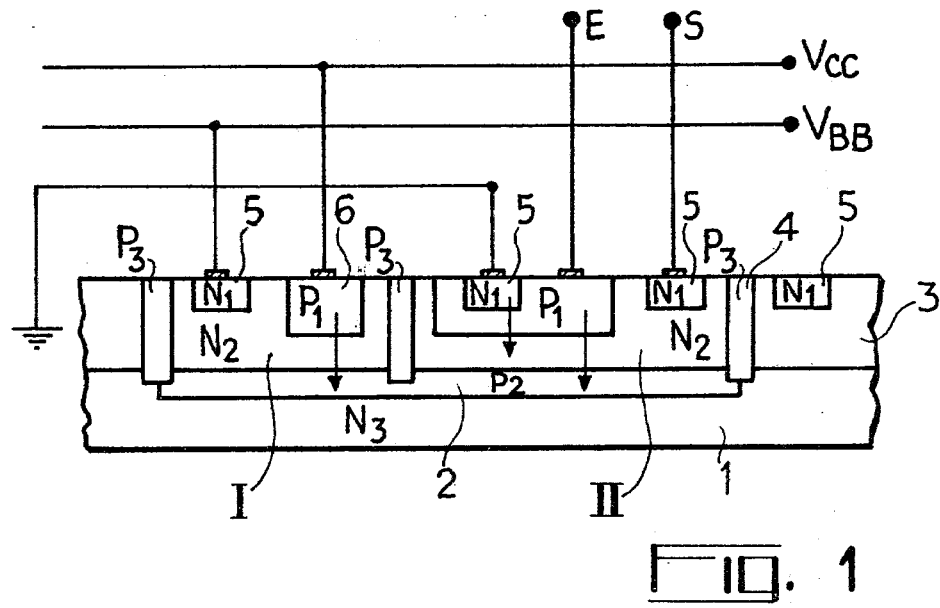
FIG. 1
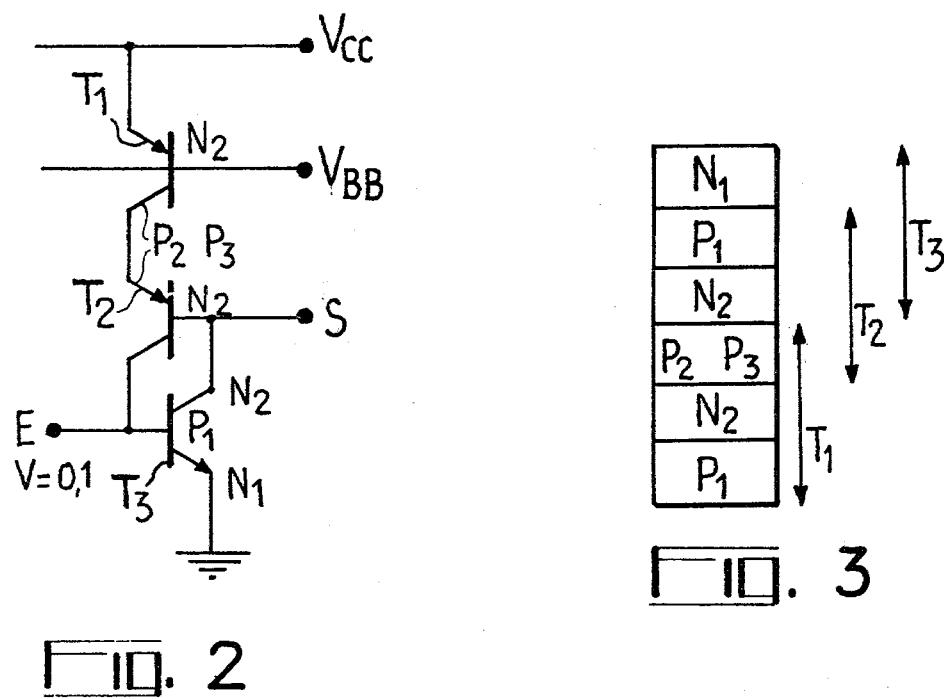
FIG. 2
FIG. 3

STRUCTURE FOR LOGIC CIRCUITS

This is a continuation, of application Ser. No. 855,618 filed Nov. 29, 1977, now abandoned.

This invention relates to a new elementary structure for logic circuits.

It is known that numerous types of elementary semiconductor structures have been proposed for this purpose. Some of these structures are composed of complementary PNP and NPNP transistors. They have numerous advantages, but also disadvantages. In particular, they require numerous interconnections which often lead to multilayer circuits which is detrimental to the "integration density", i.c. limits the number of elements integrated on the same surface of a substrate.

Finally, most of them comprise as basic element an assembly of two NPN and PNP transistors, one (the PNP transistor) being of the lateral type in which the current flows parallel to the surface of the substrate, and the other of the transverse type, i.e. in which the current flows perpendicularly to that surface.

The gain of the first transistor is still very low (distinctly less than 1).

The present invention relates to a new elementary structure for logic circuits which enables these disadvantages to be obviated.

The structure for logic circuits according to the invention comprises a first transistor of a first type (PNP or NPN) which acts as a current source and of which the base and emitter are respectively connected to fixed biassing sources, a second transistor of the same type as the first transistor and a third transistor of complementary type, the last two transistors forming an alternation of semiconducting junctions. It is characterised in that the second and third transistors are of the vertical type and are surrounded by an insulating housing which forms a semiconducting junction with the substrate, a first part of this housing acting as collector to the first transistor and a second part as emitter to the second transistor.

The invention will be better understood from the following description in conjunction with the accompanying drawings, wherein:

FIG. 1 is a transverse section of a first example of embodiment.

FIGS. 2 and 3 are equivalent circuit diagrams.

FIG. 1 is a cross-section of a first example of embodiment of the invention. On a substrate 1 of N-type of conductivity and impurity concentration $N_3$, there has been diffused from one of its surfaces a layer 2 having the opposite conductivity type, namely P-type conductivity, and doping concentration $P_2$.

Figure 4:
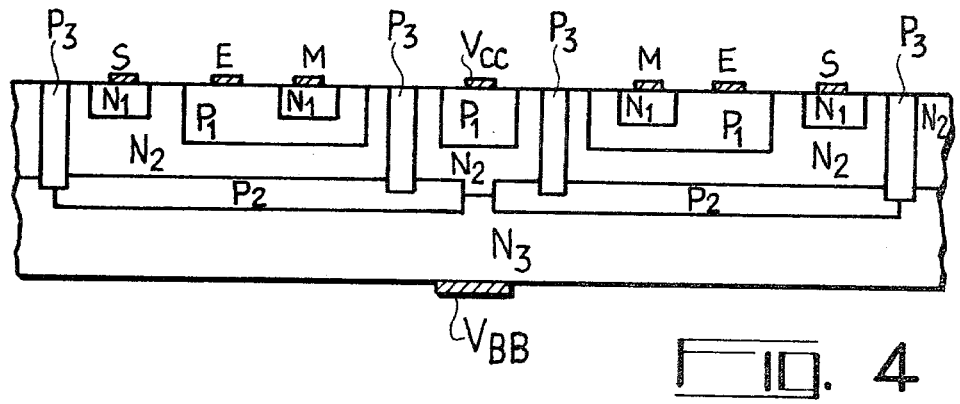
FIGS. 4, 5 and 6 are respective cross-sections of three examples of embodiment of the invention.

A second layer 3 of N-type conductivity and doping concentration $N_2$ has been formed on the assembly by epitaxial growth. After completion of this operation, the layer 2 extends both into the layer 1 and into the layer 3, as already known, this being the consequence of the phenomena of migration of the P-type impurities.

Finally, insulating walls 4 of P-type conductivity and density $P_3$ have been diffused from the surface of the zone 3. These walls reach the layer 2 and, with it, form closed, insulating housings which prevent the N-type carries from crossing the potential barriers.

Two housings are thus formed; the housing I and the housing II.

In the housings I and II, zones 5 of N-type conductivity and doping concentration $N_1$ are diffused through the same mask. Zones 6 of doping $P_1$ are diffused through another mask.

The dopings $N_1$ and $P_1$ are respectively higher than those of the adjoining layers.

In the housing I, the layer $N_1$ diffused into a layer $N_2$ acts as a contact point on the layer $N_2$ which is the base of a PNP transistor of which the zone 6 ($P_1$) is the emitter and the zone 2 ($P_2$) the collector. The zones 5 ($N_1$) and 6 ($P_1$) are provided with contact points which enable them to be respectively connected to connections $V_{BB}$ and $V_{CC}$ respectively connected to two biassing d.c supplies not shown.

The housing II comprises two transistors, one a PNP transistor and the other an NPN transistor. The PNP transistor has the zone $P_1$ as its collector, the zone $N_2$ as its base and the zone $P_2$ as its emitter. It is therefore a vertical transistor of which the gain much better than that of lateral transistors.

In addition, its emitter and the collector, i.e. the zones $P_2$ and $P_3$ of the transistor of the housing I are electrically inter connected and at the same potential and no external connection is necessary.

The NPN transistor has the zone $N_1$ as its emitter, the zone $P_2$ as its base and the zone $N_2$ as its collector.

The equivalent circuit diagram is shown in FIG. 2. The housing II comprises the double PNPN transistor of which one ($T_3$)—NPN—has its emitter connected to earth (layer $N_1$), its base $P_1$ connected to the input of the circuit and acts as collector to the PNP-type transistor $T_2$. The base of this transistor $T_2$, i.e. the zone $N_2$, acts as collector to the transistor $T_3$ and is the output of the structure.

The emitter of the transistor $T_2$ is connected to the collector of the transistor $T_1$ acting as a constant current source.

FIG. 3 shows the assembly formed by the six layers and the corresponding arrangement of the three transistors.

The assembly described is a logic inverter. If the input is at the level "0", it blocks the transistor $T_3$ and insulates the output S from earth. The output S is at the level "1". Similarly, it can easily be shown that, if the input E is at the level "1", the transistor $T_1$ is conductive and the output S is connected to earth, i.e. is at the level "0".

The preceding structure makes its possible to avoid any surface connection between the transistor $T_1$ and the transistor $T_2$. It follows from this that the spaces reserved for the connections are reduced.

The following figs show cross-sectional view of further embodiments of the invention.

FIG. 4 shows a current source feeding two symmetrical inverters. In this fig. and in the following figs, the same reference denote the same elements.

In FIG. 4, the same current source feeds two inverters constructed in the same way as in FIG. 1. The layer 2 ($P_2$) is in two parts; the two closed housings contain two identical inverters. The current source comprises a zone $P_1$ which is the emitter of the transistor. The base is formed by the substrate to which the voltage $V_{BB}$ is applied.

This transistor may be considered as being both lateral and transversal.

This form is detrimental to the gain of the current source transistor, but provides for a greater integration density, because there is no need for a surface contact point ($N_1$) for the current source transistor.

Figure 5:
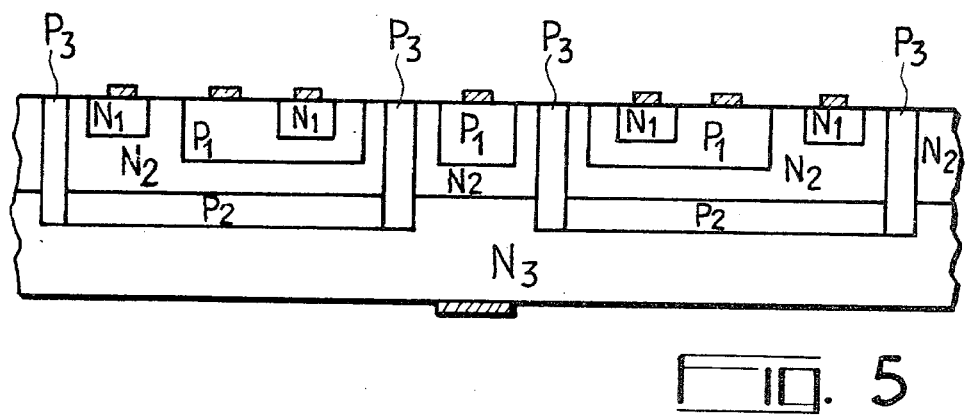

FIG. 5 differs from FIG. 4 in the omission of the layer $P_2$ level with the source transistor which is thus formed in fact by two lateral transistors.

The technology is more simple and the access resistance to the base is lower, but the collector $P_1$ has to be positioned with accuracy relative to the insulating walls.

Figure 6:
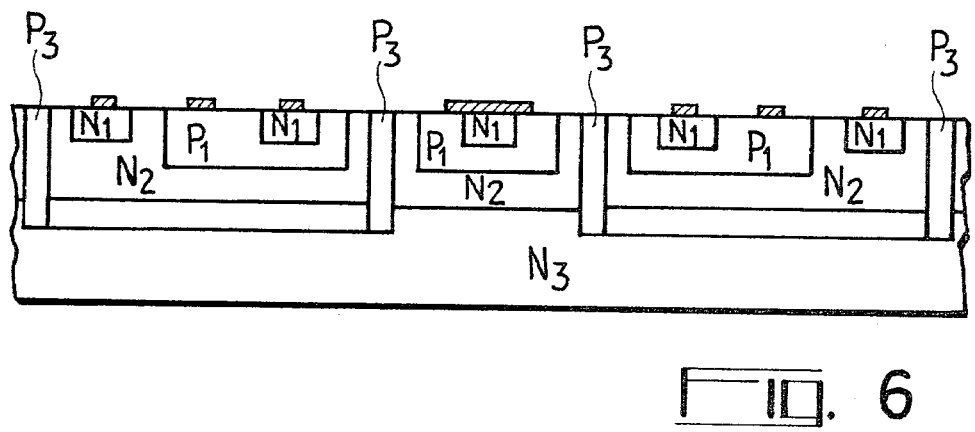

In FIG. 6, a diffusion $N_1$ of high impurity density has been provided in the layer $P_1$ of less doping concentration and a common contact is provided for these two elements. It can be shown that the gain of the lateral transistor acting as current source can have an efficiency increased by a factor of the order of 5.

Figure 7:
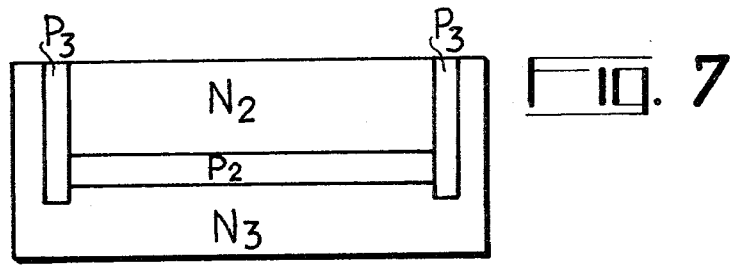
FIG. 7 is an end-on view of the structure according to the invention.

FIG. 7 is an end-view of the element according to the invention.

This fig. clearly shows the arrangement of the layers $N_2$ and $N_3$ on the one hand and the layer $P_2$ and the walls $P_3$ on the other hand.

Figure 8:
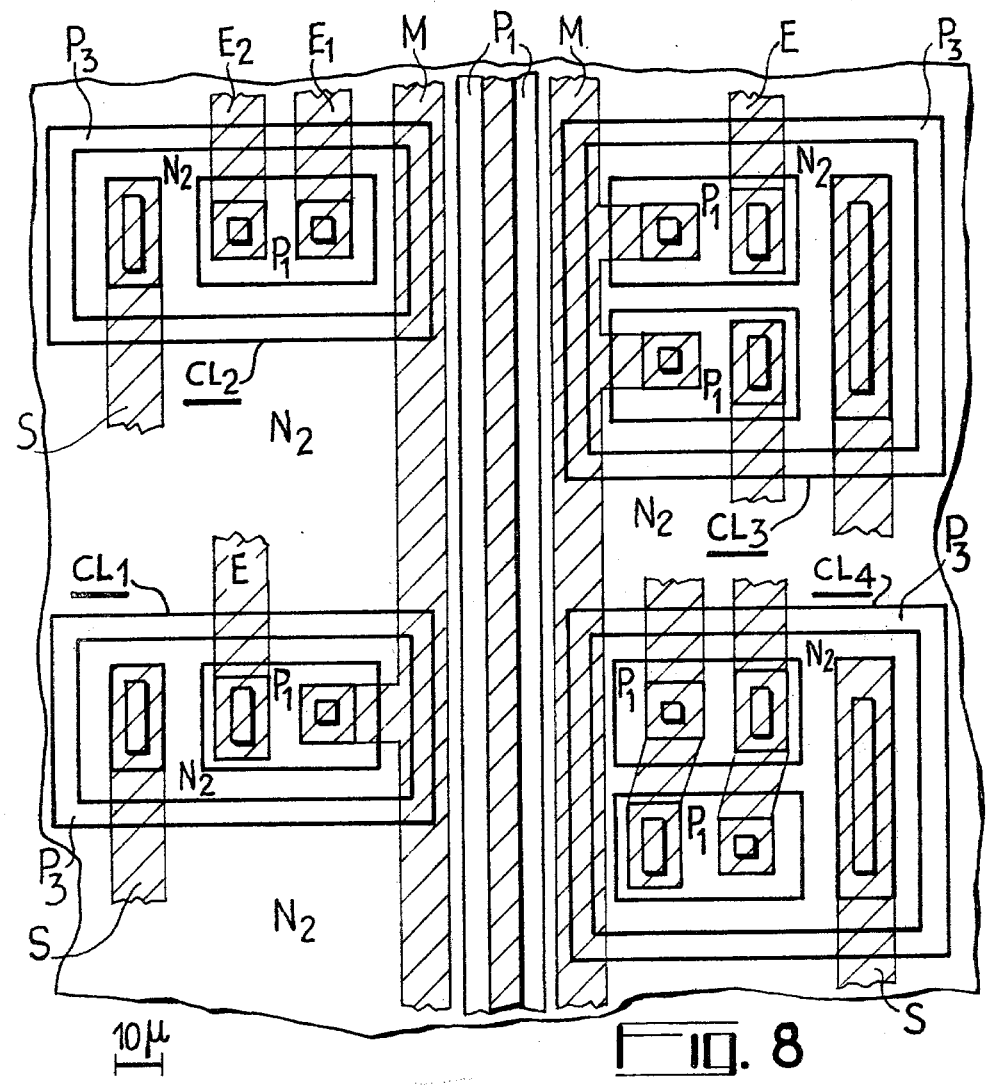
FIG. 8 is a plan view of logic circuits using the structure according to the invention.

FIG. 8 is a plane view of several logic circuits comprising elements according to the invention. It can be seen at $CL_1$ an inverter such as that illustrated in the preceding figs. It is inserted into a rectangle formed by walls $P_3$. The white zone represents the top of the substrate free from any implantation or diffusion. The left-hand zone $N_1$ of the fig. represents the contact point on the zone $N_2$. The right-hand zone $N_1$ of the fig. is the zone 5 of FIGS. 4 or 5 which is connected to earth by the connection marked M.

Input voltage is applied to the metallisation E and the output is collected at the metallisation 5.

The metallic connection Vcc covers a region $P_1$, the source transistor being of the same type as FIG. 4 or 5. The whole forms a layer extending over the substrate and feeding the various structures by way of the walls $P_3$.

The connection $V_{BB}$ is not shown, being connected to the lower part of the substrate.

Figure 9:
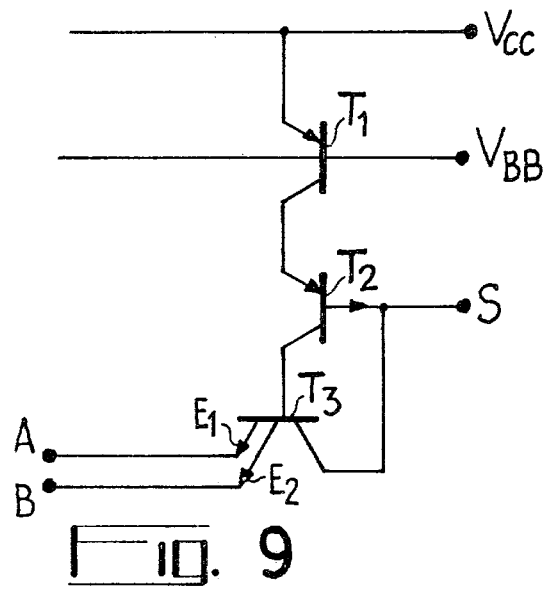
FIGS. 9 to 11 are their respective equivalent circuit diagrams.

An AND circuit is integrated in an adjacent rectangle $CL_2$, the equivalent diagram of this latter being shown in FIG. 9.

In this arrangement, the transistor $T_3$ has two emitters $E_1$ and $E_2$ receiving voltages at two levels 0 and 1. If one of these levels is in the O-state, the transistor $T_3$ is conductive and the output S in the O-state. Contrarily, to that, if both these levels are in the 1-state, the output is at the level 1 and the logic operation performed is the operation S=A.B.

Figure 10:
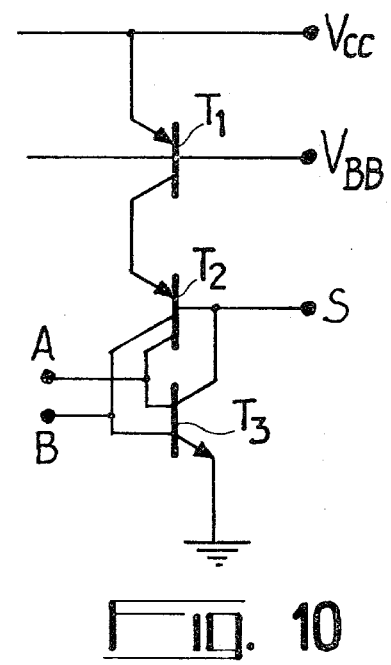

The circuit $CL_3$, of which the equivalent diagram is shown in FIG. 10 performs the NOR (OR-NO) function.

The transistor $T_2$ has two collectors connected respectively to the base of the transistor $T_3$.

It performs the operation $S = \overline{A+B}$. The two inputs A,B are connected to the two collectors of the transistor $T_2$.

A voltage 1 applied by one of these inputs or by both of them to the transistor $T_2$ renders this transistor conductive and connects the output, i.e. its collector, to earth at level "0". If the two inputs are at the level "0", the output is in the "1"-state (transistor $T_3$ blocked).

The circuit $CL_4$ is a complemented exclusive-OR circuit or, in normal language, $\overline{XOR}$.

Figure 11:
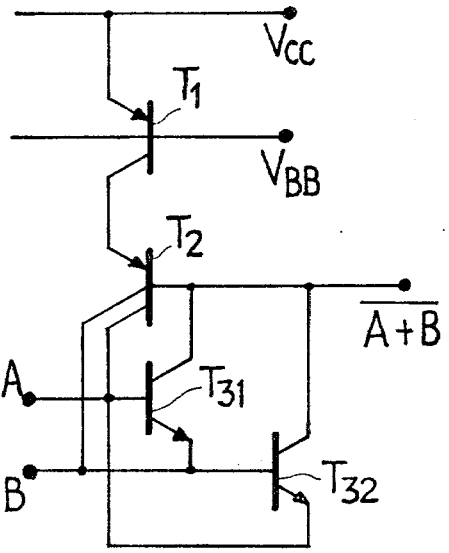

Its equivalent diagram is shown in FIG. 11.

The transistor $T_3$ is replaced by two transistors $T_{31}$ and $T_{32}$.

The transistor $T_2$ has a base and two collectors connected respectively to the two bases of the transistors $T_{31}$ and $T_{32}$.

The emitter of the transistor $T_{31}$ is connected to the base of the transistor $T_{32}$ and the two inputs are applied to the two bases of the transistors $T_{31}$ and $T_{32}$. As can readily be shown, the truth table of this circuit is a follows:

|   | B | |
|---|---|---|
| A | 1 | 0 |
| 1 | 1 | 0 |
| 0 | 0 | 1 |

Numerous analog circuits fall within the scope of the present invention.

This element has various advantages over known circuits. The four-layer component comprises only vertical transistors. This results in a more favourable configuration of the PNP transistors and in the possibility of increasing the cutoff frequency.

The majority of connections are buried which enables the integration density to be increased.

The assembly as a whole comprises only six semiconducting layers and can be produced very easily by successive epitaxy and diffusion, or ion implantation.

What I claim is:

1. An integrated logic circuit comprising:
   a substrate layer of semiconductor material having a first conductivity type;
   a first layer of semiconductor material of said first conductivity type epitaxied upon said substrate layer;
   at least one second layer of semiconductor material inserted between said substrate layer and said first layer, said second layer being of a second conductivity type opposite to said first conductivity type;
   walls of semiconductor material of said second type extending from the surface of said first layer of semiconductor material through said second layer of semiconductor material so as to form therewith at least first and second insulating boxes;
   said first box including semiconductor material regions forming a first bipolar transistor having an emitter region of said second conductivity type diffused into said first layer, a base region, a collector region, and contact means for coupling said collector and said base regions to power sources;
   said second box including second and third complementary transistors, said second transistor including a collector region of said second conductivity type diffused into said first layer, a base region, and an emitter region, and said third transistor including a collector region of said first conductivity type diffused so as to be in contact with said collector region of said second transistor, a base region coinciding with said emitter region of said second transistor and an emitter region; and
   contact input means coupled to said collector region of said second transistor and contact output means coupled to said collector region of said third transistor.

2. A structure as claimed in claim 1, wherein said first transistor is of the PNP type.

3. A structure as claimed in claim 1, wherein said first transistor has at least part of its collector formed by one of the insulating walls of the housing completely surrounding the second and third transistors.

4. A structure as claimed in claim 3, wherein d.c connection means capable of biassing the base of the first transistor are connected to the substrate.

5. An integrated logic circuit according to claim 1 wherein a semiconductor material region having the opposite conductivity type to that of the emitter region of the first transistor is inserted into the first transistor, a common electrical contact point being formed on this region and said emitter.

6. An integrated logic circuit according to claim 1 wherein said collector region of said first transistor and said emitter region of said second transistor are formed by the same semiconductor material region.

* * * * *